United States Patent [19]

Nishimura et al.

[11] Patent Number: 4,672,582

[45] Date of Patent: Jun. 9, 1987

[54] SEMICONDUCTOR DEVICE

[75] Inventors: Yasumasa Nishimura; Kazuyasu Fujishima; Masaki Kumanoya, all of Itami, Japan

[73] Assignee: Mitsubishi Denki Kabushiki Kaisha, Tokyo, Japan

[21] Appl. No.: 738,262

[22] Filed: May 28, 1985

[30] Foreign Application Priority Data

Jun. 7, 1984 [JP] Japan ................. 59-117754

[51] Int. Cl.$^4$ ............................................. G11C 7/00
[52] U.S. Cl. ...................................... 365/201; 365/189
[58] Field of Search ............... 365/189, 201, 230, 233; 371/21

[56] References Cited

U.S. PATENT DOCUMENTS 4,464,750 8/1984 Tatematsu .............................. 371/21
4,541,090 9/1985 Shiragasawa ......................... 371/21

OTHER PUBLICATIONS

"A Programmable 265K CMOS EPROM with On—Chip Test Circuits", by S. Tanaka et al, ISSCC 84/Thurs., Feb. 23, 1984.

Primary Examiner—Joseph A. Popek
Attorney, Agent, or Firm—Lowe, Price LeBlanc, Becker & Shur

[57] ABSTRACT

A semiconductor device is provided which can be efficiently subjected to a function test at a high speed by write/read operations for each plurality of bits. The semiconductor device according to the present invention comprises an encoder for encoding a 1-bit signal to a signal of a plurality of bits and a decoder receiving a signal of a plurality of bits for decoding the same to a 1-bit signal in response to the states thereof, so as to simultaneously write each bit of the plurality of bits from the encoder in each corresponding memory cell of a plurality of simultaneously selected memory cells in a writing test mode, and to simultaneously read information signals stored in the plurality of simultaneously selected memory cells in a reading test mode thereby to decode the signals to a 1-bit signal corresponding to the plurality of information signals.

3 Claims, 3 Drawing Figures

SEMICONDUCTOR DEVICE

BACKGROUND OF THE INVENTION

1. Field of the Invention

The present invention relates to a semiconductor device, and more particularly, it relates to a semiconductor device provided with testing logic circuits which can efficiently implement a function test at a high speed.

2. Description of the Prior Art

FIG. 1 is a block diagram schematically illustrating structure of a conventional semiconductor device. A semiconductor device 1 as shown in FIG. 1 comprises a memory unit 2 formed by four memory blocks 2a, 2b, 2c and 2d which are equal in storage capacity with each other, an address signal decoder circuit 3 for decoding address signals received through address input pins 4 thereby to supply the most significant address internal signal 3b to a nibble control block 7 and other address internal signals 3a to the memory unit 2, a latch circuit 6 for latching input data signals received through a data input pin 5 to supply the latched data signals and reading-writing mode switching signals to the nibble control block 7, the nibble control block 7 whose sequence is controlled by the most significant address signal 3b from the decoder circuit 3 thereby to sequentially write or read data signals in or from the respective memory blocks 2a, 2b, 2c and 2d and an output buffer 9 for outputting output signals from the nibble control block 7 sequentially through a data output pin 10. Now, writing/reading operations of the semiconductor device 1 will be described with reference to FIG. 1.

In a writing operation to the memory unit 2, the data input pin 5 of the semiconductor device 1 receives information signals at "high" or "low" logical levels. The information signals are latched in the latch circuit 6 through an input data bus 5a. The information signals thus latched into the latch circuit 6 are transferred to the I/O-nibble control block 7. The nibble control block 7 enters a writing mode by writing/reading mode switching signals from the latch circuit 6. Further, the decoder circuit 3 supplies the most significant address internal signal 3b in signals obtained by decoding address signals 4a to the nibble control block 7 while supplying other address internal signals 3a to the memory unit 2. The address internal signals 3a other than the most significant one 3b specify one memory cell for each of the memory blocks 2a, 2b, 2c and 2d. In other words, four memory cells are simultaneously selected by the address internal signals 3a. The most significant address internal signal 3b specifies the sequence for writing information signals in the selected four memory cells. The nibble control block 7, the sequence of which is controlled by the most significant address internal signal 3b, sequentially writes the information signals from the latch circuit 6 into the selected four memory cells. The aforementioned sequential operation is generally called as nibble writing.

In the reading operation, the nibble control block 7 enters a reading mode by the writing/reading mode switching signal from the latch circuit 6. The decoder circuit 3 decodes the address signals 4a received through the data input pins 4, thereby to supply the most significant address internal signal 3b to the nibble control block 7 and the other address internal signals 3a to the memory unit 2. The address internal signals 3a other than the most significant one select one memory cell for each of the memory blocks 2a, 2b, 2c and 2d. Since the nibble control block 7 is in the reading mode, the information signals present in the selected four memory cells are simultaneously supplied to the nibble control block 7 through data buses 8a, 8b, 8c and 8d. The most significant address internal signal 3b specifies the sequence for reading the information signals from the memory blocks 2a, 2b, 2c and 2d. The nibble control block 7, the sequence of which is controlled by the most significant address internal signal 3b, sequentially supplies the information signals from the selected four memory cells to the output buffer 9 through a data bus 7a. The output buffer 9 sequentially transfers the received information signals to the data output pin 10. The aforementioned sequential reading operation is generally called as nibble reading.

The function test of a conventional semiconductor device has been performed by employing the above described nibble writing/reading operations sequentially with respect to all of memory cells in a memory unit. In such a conventional method, however, addresses must be specified with respect to all of the memory cells forming the memory unit. Consequently, the time required for the function test is increased following increase in number of the memory cells forming a high-density memory unit, leading to increase in time for identifying the quality of semiconductor devices by function tests in production lines.

SUMMARY OF THE INVENTION

An object of the present invention is to provide a semiconductor device to which testing logic circuits are added thereby to remove the aforementioned disadvantages of the prior art and reduce the time required for a function test of the semiconductor device.

Briefly stated, the present invention provides a semiconductor device comprising encoder means which enters an activated state only in a writing mode of function test modes and can convert 1-bit input information signals into those of a plurality of bits thereby to simultaneously write the said converted plurality of bits of information signals in a plurality of memory cells selected by signals for specifying the memory cells, and decoder means which enters an activated state only in a reading mode of the function test modes and can simultaneously receive information signals from a plurality of memory cells selected by signals for specifying the memory cells thereby to convert the same into 1-bit signals, so as to perform a function test by processing a plurality of memory cells as a unit, thereby to reduce the time required for the function test.

Preferably the signals for specifying the memory cells are address internal signals other than the most significant one, and the number of the simultaneously selected memory cells is four.

The prior art of performing a function test by processing a plurality of memory cells as a unit is disclosed in "A Programmable 256K CMOS EPROM with On-Chip Test Circuits" by S. Tanaka et al., ISSCC 84/Thurs., Feb. 23, 1984.

However, the present invention is absolutely different in structure and system from the prior art.

The above and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
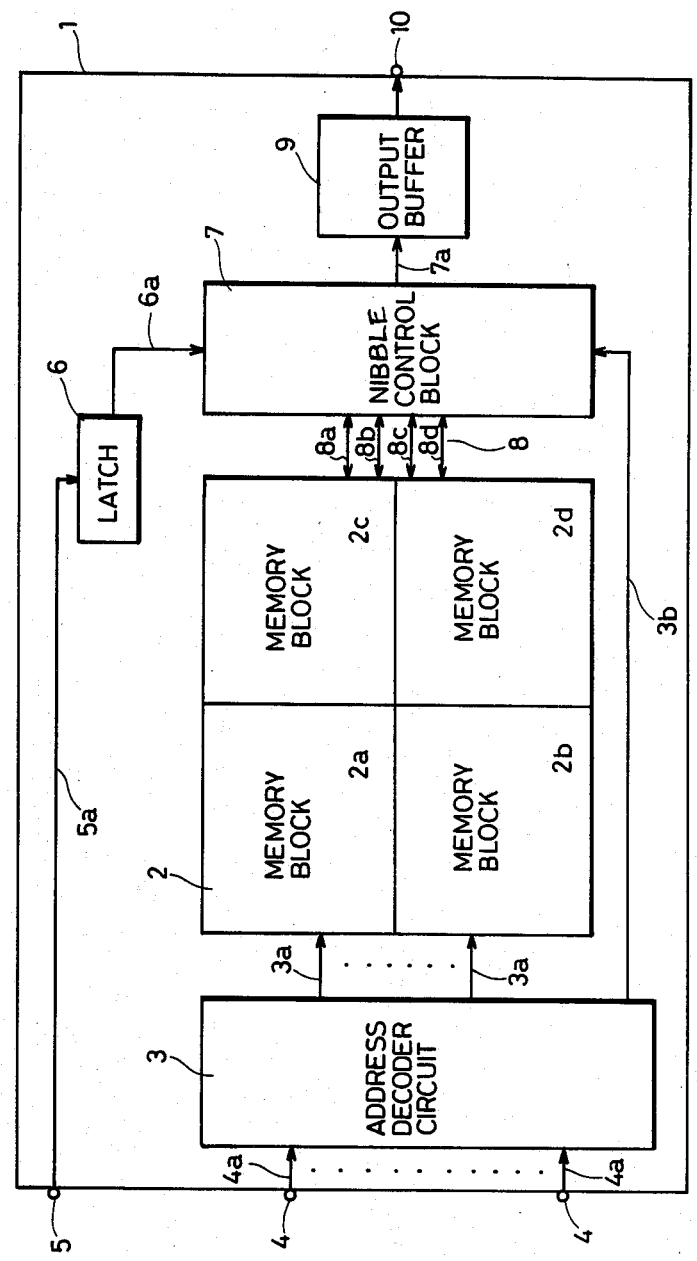
FIG. 1 is a block diagram schematically showing structure of a conventional semiconductor device.
Figure 2:
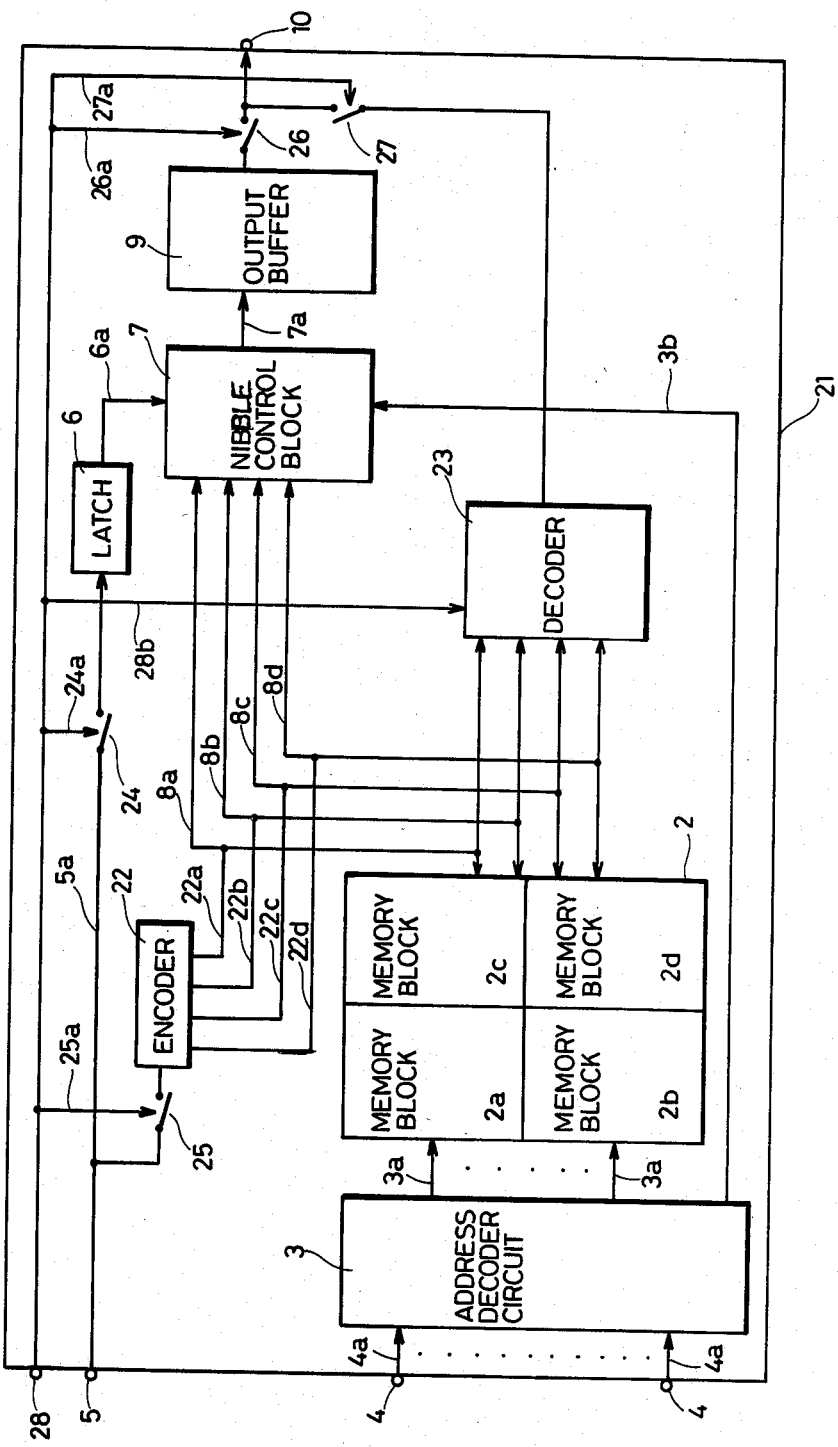
FIG. 2 is a block diagram schematically showing structure of a semiconductor device according to the present invention.

FIG. 2 is a block diagram schematically showing structure of a semiconductor device with testing logic circuits according to an embodiment of the present invention. A semiconductor device 21 as shown in FIG. 2 includes, in addition to those in the conventional semiconductor device (shown in FIG. 1), a control signal pin 28 which receives test mode selecting signals for specifying test modes and encoder and decoder circuits 22 and 23 which are electrically connected in a parallel manner with a nibble control block 7 to operate only in test modes. The encoder circuit 22, which is adapted to encode 1-bit signals to 4-bit signals, is connected at its input portion to an input terminal 5 through an input data line 5a and a relay circuit 25, while four output lines 22a, 22b, 22c and 22d thereof are respectively connected to data buses 8a, 8b, 8c and 8d of a memory unit 2. The decoder circuit 23, which is adapted to decode 4-bit signals to 1-bit signals, is connected at its input portion to memory blocks 2a, 2b, 2c and 2d through the four data buses 8a, 8b, 8c and 8d, while its output portion is connected to an output terminal 10 through a relay circuit 27.

The decoder circuit 23 enters an activated or inhibited state in response to the test mode selecting signals received through a signal line 28b.

Further, in order to bring the nibble control block 7 into an inhibited state in the test mode, a relay circuit 24 is connected in series with a latch circuit 6 to be in immediate front of its input portion. For the same purpose, a relay circuit 26 is connected between an output portion of an output buffer circuit 9 and the output terminal 10. These relay circuits 24, 25, 26 and 27 operate in response to the test mode selecting signals received from the input terminal 28 respectively through signal lines 24a, 25a, 26a and 27a. Operations in the test modes of the semiconductor device are now described.

In a writing operation, the control signal terminal 28 receives writing test mode selecting signals. In response to the writing mode selecting signals, the relay circuits 25 and 27 are both made conductive while the relay circuits 24 and 26 are both brought into cutoff states. After the above sequential operation, the semiconductor device 21 enters a writing test mode. Then the data input pin 5 receives an information signal of "high" or "low" logical level, which are supplied to the encoder circuit 22 through the relay circuit 25. The encoder 22 encodes the 1-bit information signal received therein into a 4-bit signal, thereby to supply the encoded signals to the memory unit 2 through the signal lines 22a, 22b, 22c and 22d. At this time, the address signal decoder circuit 3 decodes address signals received through input terminals 4 to supply address internal signals 3a other than the most significant one to the memory unit 2. Consequently, four memory cells are simultaneously selected from the memory blocks 2a, 2b, 2c and 2d in the memory unit 2, i.e., one cell from each block. The most significant address internal signal 3b is supplied to the nibble control block 7 which is brought into an inhibited state by the relay circuit 24. Therefore, the 4-bit information signal from the encoder circuit 22 is simultaneously written in the selected 4-bit memory cells through the data buses 8a, 8b, 8c and 8d. The aforementioned operation is applied to address input signals in all combinations of the address internal signals except for the most significant address internal signal, whereby input data can be written in all of the memory cells in the memory unit 2.

In a reading operation from the memory unit 2, the control signal terminal 28 receives reading test mode selecting signals, whereby the relay circuits 25 and 27 enter ON states through the signal lines 25a and 27a while the relay circuits 24 and 26 enter OFF states through the signal lines 24a and 26a, similarly to the writing mode. The decoder circuit 23 receives the selecting signals through the signal line 28b, to be activated. By this sequential operation, the semiconductor device 21 enters a reading test mode. The address input pins 4 receive address signals, which are supplied to the address signal decoder circuit 3 through address signal lines 4a. The address decoder circuit 3 decodes the address signals, to supply the address internal signals 3a other than the most significant one to the memory unit 2. In response to the address internal signals 3a other than the most significant one, four memory cells are simultaneously selected from the memory blocks 2a, 2b, 2c and 2d, i.e., one from each block. Information signals present in the selected four memory cells are then simultaneously read on the data buses 8a, 8b, 8c and 8d. Since the relay circuit 26 is in an OFF state, no signal is outputted at the output terminal 10 from the nibble control block 7. On the other hand, the decoder circuit 23 is in an activated state, whereby the signals read out onto the data buses 8a, 8b, 8c and 8d are decoded to 1-bit signal by the decoder circuit 23. The 1-bit signal thus outputted from the decoder circuit 23 is one of five different signals produced by combinations of the selected 4-bit signals. The combinations of the five different signals are as follows: all four bits being of "0" in logic, 3 bits of "0" plus one bit of "1", two bits of "0" plus two bits of "1", one bit of "0" plus three bits of "1" and all four bits being of "1".

The 1-bit signal thus decoded in the decoder circuit 23 is supplied to the output pin 10 through the relay circuit 27. The output pin 10 detects the derived signal, thereby to make a decision as to whether or not the semiconductor device 21 satisfies desired functions, i.e., whether or not it functions exactly as designed. The aforementioned operation is applied to all combinations of the address internal signals 3a other than the most significant one, whereby the function test can be performed on all of the memory cells in the memory unit 2.

Figure 3:
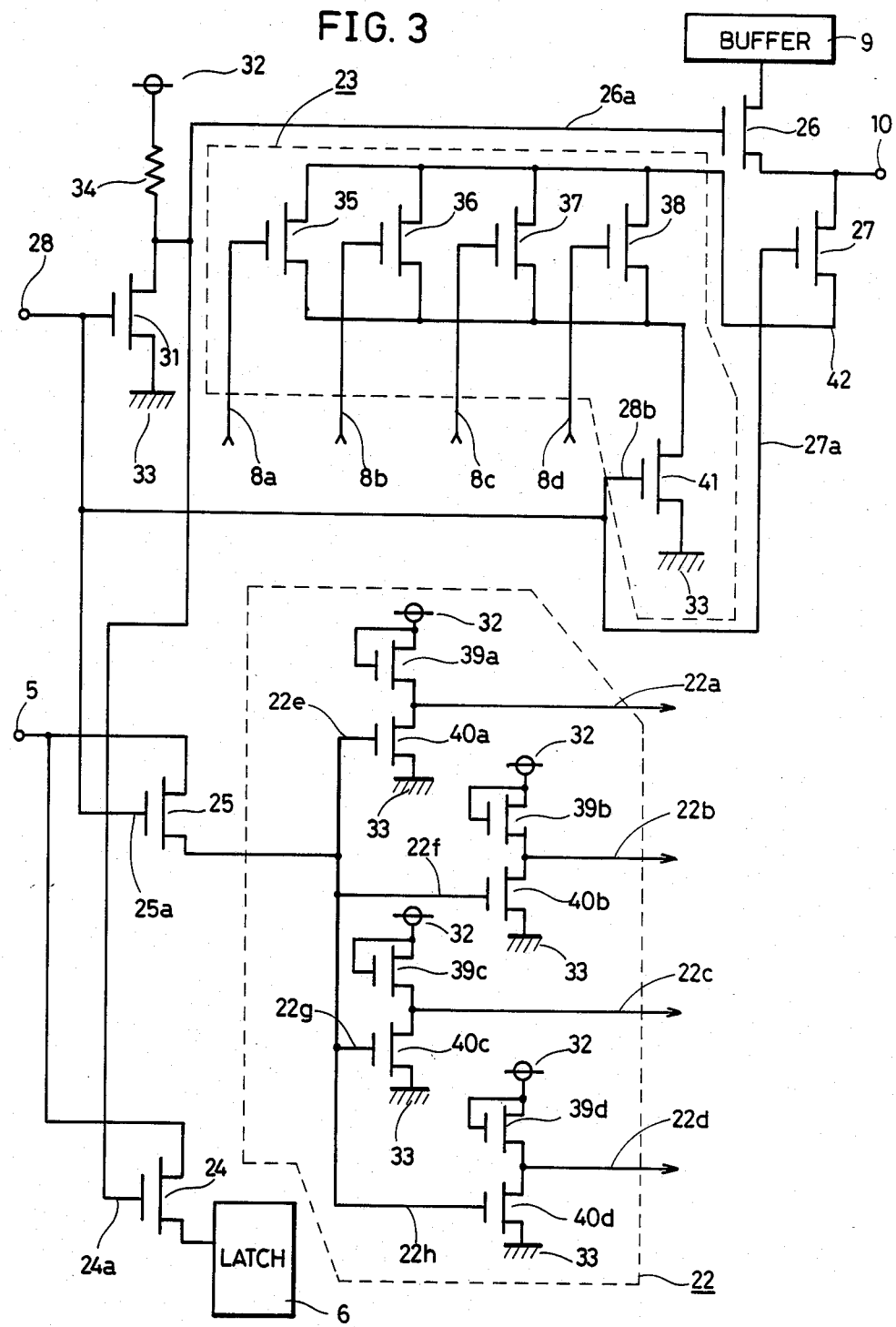
FIG. 3 is illustrative of examples of an encoder circuit and a decoder circuit included in the semiconductor device as shown in FIG. 2.

FIG. 3 is an illustration showing an example of a specific structure of the encoder and decoder circuits included in the semiconductor device as shown in FIG. 2. Now, the structure and operations of the encoder and decoder circuits will be described with reference to FIG. 3.

In FIG. 3, an encoder circuit 22 is formed by four inverter circuits which are connected to one conductive terminal of a transistor switch 25 in a parallel manner with each other. A first inverter circuit connected to a signal line 22e is formed by a diode-connected MOS transistor 39a and an n-channel MOS transistor 40a which receives signals from a transistor 25 at its gate. Outputs from the first inverter circuit are supplied to a signal line 22a. A second inverter circuit, which is adapted to invert signals on a signal line 22f to output the same on a signal line 22b, is formed by a diode-connected n-channel MOS transistor 39b and an n-channel MOS transistor 40b which receives signals on the signal line 22f at its gate. A third inverter circuit is formed by a diode-connected n-channel MOS transistor 39c and an n-channel MOS transistor 40c which receives signals on a signal line 22g at its gate. Outputs of the third inverter circuit are supplied on a signal line 22c. A fourth inverter circuit is formed by a diode-connected n-channel MOS transistor 39d and an n-channel MOS transistor 40d which receives signals on a signal line 22h at its gate. Outputs of the fourth inverter circuit are supplied on a signal line 22d. Respective one end of the diode-connected MOS transistors 39a, 39b, 39c and 39d is connected to a power source 32 while respective one end of the MOS transistors 40a, 40b, 40c and 40d is connected to a ground potential 33.

A decoder circuit 23 is formed by four n-channel MOS transistors 35, 36, 37 and 38 which are connected in parallel with each other and an n-channel MOS transistor 41 which is connected in series with the parallel-connected four MOS transistors 35, 36, 37 and 38. Respective gates of the MOS transistors 35, 36, 37 and 38 receive signals on signal lines 8a, 8b, 8c and 8d. Connecting terminals (terminals not connected with the MOS transistor 41) of the MOS transistors 35, 36, 37 and 38 are connected with one conductive terminal of a MOS transistor 27 through a signal line 42. The gate of the MOS transistor 41 is connected to a signal line 28b to receive test mode selecting signals supplied at the terminal 28, while one conductive terminal thereof is connected to the ground potential 33.

An inverter circuit comprising a resistor 34 and an n-channel MOS transistor 31 is provided between the gates of the switching transistors 24 and 26. On the other hand, the gates of the switching transistors 25 and 27 directly receive the test mode selecting signals applied to the terminal 28. Operations of the circuits are now described with reference to FIGS. 2 and 3.

In a writing operation, a signal at "high" logical level is applied to the test mode selecting signal input terminal 28, whereby the switching transistors 25, 27 and 41 enter ON states. On the other hand, an inverter circuit formed between a $V_{CC}$ power source 32 and the ground potential 33 by the resistor 34 and the MOS transistor 31 outputs signals at "low" logical level on the signal lines 24a and 26a, whereby the switching transistors 24 and 26 enter OFF states. By the aforementioned sequential operation, the semiconductor device 21 enters a writing test mode. Then a signal at "high" or "low" logical level is supplied to the data input terminal 5. This writing information signal is transferred through the MOS transistor 25 on the respective signal lines 22e, 22f, 22g and 22h, to be supplied to gates of the MOS transistors 40a, 40b, 40c and 40d. The signal supplied on the signal line 22e is inverted in level by the first inverter circuit formed by the MOS load transistor 39a and the MOS transistor 40a to be outputted on the signal line 22a. In a similar manner, the signals on the signal lines 22f, 22g and 22h are respectively inverted by the second, third and fourth inverter circuits to be transferred on signal lines 22b, 22c and 22d. Thus, the 1-bit signal supplied to the input terminal 5 is encoded to 4-bit signal, to be simultaneously supplied to the memory unit 2 through the signal lines 22a, 22b, 22c and 22d. At this time, the address internal signals 3a other than the most significant one, decoded by the address signal decoder circuit 3, are supplied to the memory unit 2. Further, the MOS transistor 24 is in an OFF state, and hence the information signals supplied to the input terminal 5 are not transferred to the nibble control block 7. Therefore, writing through the nibble control block 7 is not performed and the signal levels on the signal lines 8a, 8b, 8c and 8d are uniquely determined by the states of the signals on the signal lines 22a, 22b, 22c and 22d. The 4-bit signal supplied to the memory unit 2 through the signal lines 22a, 22b, 22c and 22d is simultaneously written in memory cells in the respective memory blocks 2a, 2b, 2c and 2d corresponding to the address internal signals 3a. The aforementioned operation is applied to address input signals obtained by all combinations of the address internal signals 3a other than the most significant address internal signal 3b, whereby the input data can be written in all of the memory cells in the memory unit 2.

In a reading operation, signals of "high" logical level are applied to the input terminal 28. In response to the test mode selecting signals, the MOS transistors 25, 27 and 41 enter ON states and the MOS transistors 24 and 26 enter OFF states similarly to the writing test mode. At this time, signals at "high" logical level are applied to the data input terminal 5, whereby the signal lines 22a, 22b, 22c and 22d are retained at "low" logical levels. By the aforementioned sequential operation, the semiconductor device 21 enters a reading test mode. Then address signals are applied to the address input terminal 4. The address signal decoder circuit 3 decodes the address signals supplied through the address signal lines 4a, thereby to supply the address internal signals 3a other than the most significant one. Consequently, in accordance with the address internal signals 3a, information signals in the corresponding memory cells in the respective memory blocks 2a, 2b, 2c and 2d are simultaneously read out onto the signal lines 8a, 8b, 8c and 8d. Since the MOS transistor 26 is in an OFF state, the output signal from the nibble control block 7, which is controlled by the most significant address internal signal 3b, is not transferred to the output terminal 10. Further, the signals on the signal lines 8a, 8b, 8c and 8d are respectively supplied to gates of the MOS transistors 35, 36, 37 and 38, which in turn enter ON or OFF states respectively in response to the logical levels of the signals on the signal lines 8a, 8b, 8c and 8d. The MOS transistors 35, 36, 37 and 38 are respectively made conductive or cutoff in the following five combinations: all of four signal lines 8a, 8b, 8c and 8d being at "low" levels (all cutoff), one at a "high" level plus three at "low" levels (only one conductive), two at "high" levels plus two at "low" levels (only two conductive), three at "high" levels plus one at a "low" level (only three conductive) and all being at "high" levels (all conductive). In response to the states of the MOS transistors 35, 36, 37 and 38, currents of different levels flow on the signal line 42, then the current levels are supplied to the output pin 10 through the MOS transistor 27. Upon detection of the signals derived at the output pin 10, a decision is made as to whether or not the semiconductor device 21 satisfies desired functions, i.e., whether or not it functions exactly as designed.

It is to be noted that the encoder and decoder circuits in the aforementioned embodiment are merely examples and the present invention is not restricted to the aforementioned circuit structure. Further, inversion in logical levels of the test mode selecting signals and the combinations of the operating states of the transistor switches 24, 25, 26 and 27 are not restricted to those in the aforementioned embodiment.

Although writing/reading operations are executed through the encoder circuit 22 and the decoder circuit 23 included in the semiconductor device 21 in order to unify processing of input and output data in the test modes in the aforementioned embodiment, 4-bit data may be directly inputted and outputted simultaneously in and from the exterior of the semiconductor device, thereby to attain similar effects to the aforementioned embodiment.

Even if the memory unit 2 is divided into more than four blocks, the number of information bits processed by the encoder circuit 22 and the decoder circuit 23 in the above described embodiment may be the same as that of the blocks, on condition that a control block is provided for sequentially writing in or reading from the respective blocks.

According to the present invention as hereinabove described, a semiconductor device having a memory unit divided into a plurality of blocks is subjected to a function test simultaneously on the respective blocks with respect to specified one of memory cells included in each block of the memory unit, whereby the testing time is remarkably saved in comparison with conventional test systems.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a memory unit formed by a plurality of memory blocks, said plurality of memory blocks respectively having a plurality of memory cells for storing information signals, and having a normal mode and a test mode of operation selected by a test mode selecting signal,
    said semiconductor device comprising:
        memory cell specifying means for simultaneously specifying corresponding ones of said plurality of memory cells in respective ones of said plurality of memory blocks in order to write or read said information signals;
        block selecting means for selecting one of said plurality of memory blocks;
        means responsive to memory cell specifying signals and block selecting signals for sequentially writing said information signals in a specified cell of said memory cells of a specified block of said memory blocks or sequentially reading said information signals from the specified one of said memory cells of the specified one of said memory blocks;
        means for writing said information signals simultaneously in said specified memory cells in all of said blocks in response to said specifying signals from said memory cell specifying means;
        decoder means for reading said information signals simultaneously from said specified memory cells in all of said blocks in response to said specifying signals from said memory cell specifying means and outputting a current having a magnitude responsive to said information signals; and
        means for receiving the test mode selecting signal for specifying a test mode of said semiconductor device,
    said means for simultaneously reading said information signals or said means for simultaneously writing said information signals being enabled and said means for sequentially reading or writing said information signals being disabled in response to said test mode selecting signal.

2. A semiconductor device in accordance with claim 1, wherein said writing means is an encoder circuit.

3. A semiconductor device in accordance with claim 1, wherein said plurality of memory blocks are four memory blocks.

* * * * *